(12) United States Patent
Takemoto et al.

(10) Patent No.: US 9,961,286 B2
(45) Date of Patent: May 1, 2018

(54) SOLID-STATE IMAGING DEVICE

(71) Applicant: OLYMPUS CORPORATION, Hachioji-shi, Tokyo (JP)

(72) Inventors: Yoshiaki Takemoto, Tokyo (JP); Naofumi Sakaguchi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days. days.

(21) Appl. No.: 15/441,666

(22) Filed: Feb. 24, 2017

(65) Prior Publication Data

US 2017/0171484 A1 Jun. 15, 2017

Related U.S. Application Data

(63) Continuation of application No. PCT/JP2014/078750, filed on Oct. 29, 2014.

(51) Int. Cl.
*H04N 5/374* (2011.01)
*H01L 27/146* (2006.01)
(Continued)

(52) U.S. Cl.
CPC ......... *H04N 5/374* (2013.01); *H01L 27/1464* (2013.01); *H01L 27/14621* (2013.01);
(Continued)

(58) Field of Classification Search
None
See application file for complete search history.

(56) References Cited

U.S. PATENT DOCUMENTS

2003/0179191 A1* 9/2003 Matsuda ........... H01L 21/76254
345/204
2013/0141618 A1 6/2013 Kobayashi
(Continued)

FOREIGN PATENT DOCUMENTS

JP 2012-244331 A 12/2012
JP 2013-26713 A 2/2013
(Continued)

OTHER PUBLICATIONS

International Search Report dated Jan. 27, 2015, issued in counterpart International Application No. PCT/JP2014/078750 (2 pages).

*Primary Examiner* — James Hannett
(74) *Attorney, Agent, or Firm* — Westerman, Hattori, Daniels & Adrian, LLP

(57) ABSTRACT

There are provided a first semiconductor substrate in which a plurality of photoelectric conversion circuits, which are some circuit elements of the pixel cells including the photoelectric conversion unit, are formed in a two-dimensional matrix, a second semiconductor substrate in which a plurality of memory circuits, which are some other circuit elements of the pixel cells, are formed in a two-dimensional matrix, wherein the some other circuit elements of the pixel cells include memory units that correspond to the photoelectric conversion circuits, store electric signals output by the photoelectric conversion units, and output pixel signals according to the electric signals, and a connection electrode electrically connected to a signal line of the photoelectric conversion circuits and a signal line of the memory circuits, wherein the pixel cells are divided into a plurality of pixel groups in which the pixel cells are combined so that adjacent pixel cells are not included if pixel cells corresponding to light beams of the same wavelength band are considered to be arranged on one surface, wherein the same connection electrode is shared between the photoelectric conversion (Continued)

circuits and between the memory circuits of the pixel cells included in the same pixel group, and wherein signal lines of the photoelectric conversion circuits and signal lines of the memory circuits of the pixel cells included in different pixel groups are connected by different connection electrodes.

11 Claims, 6 Drawing Sheets

(51) Int. Cl.
  *H04N 5/378* (2011.01)
  *H04N 9/04* (2006.01)
(52) U.S. Cl.
  CPC .. *H01L 27/14627* (2013.01); *H01L 27/14634* (2013.01); *H01L 27/14636* (2013.01); *H01L 27/14641* (2013.01); *H01L 27/14645* (2013.01); *H04N 5/378* (2013.01); *H04N 9/045* (2013.01)

(56) References Cited

U.S. PATENT DOCUMENTS

| | | | |
|---|---|---|---|
| 2013/0161487 A1 | 6/2013 | Sakaguchi et al. | |
| 2014/0146208 A1 | 5/2014 | Nakajima et al. | |
| 2014/0175592 A1* | 6/2014 | Iwabuchi | H01L 27/14625 257/443 |
| 2015/0115134 A1* | 4/2015 | Solhusvik | H01L 27/14634 250/208.1 |
| 2016/0112644 A1* | 4/2016 | Nishi | H04N 5/374 348/222.1 |
| 2016/0256041 A1* | 9/2016 | Blanquart | H01L 27/14601 |
| 2016/0343770 A1* | 11/2016 | Fan | H01L 27/14643 |

FOREIGN PATENT DOCUMENTS

| | | |
|---|---|---|
| JP | 2013-118501 A | 6/2013 |
| JP | 2013-121058 A | 6/2013 |
| JP | 2013-255125 A | 12/2013 |
| JP | 2014-107797 A | 6/2014 |
| WO | 2014/007004 A1 | 1/2014 |

* cited by examiner

101a

101b

SOLID-STATE IMAGING DEVICE

This application is a continuation application based on PCT Patent Application No. PCT/JP2014/078750, filed Oct. 29, 2014.

TECHNICAL FIELD

The present invention relates to a solid-state imaging device.

BACKGROUND ART

In recent years, imaging apparatuses such as video cameras and electronic still cameras have become generally widespread. In these imaging apparatuses (hereinafter referred to as "cameras"), charge coupled device (CCD) type solid-state imaging des sees and amplification type solid-state imaging devices are used. An amplification type solid-state imaging device guides an electric signal generated and stored by a photoelectric conversion unit such as a photodiode provided in a pixel on which light is incident to an amplification unit provided in the pixel and outputs the signal amplified by the amplification unit from the pixel. In the amplification type solid-state imaging device, a plurality of pixels is arranged in a two-dimensional matrix to form a pixel array unit. Among amplification-type solid-state imaging devices, there are, for example, CMOS type solid-state imaging devices and the like using complementary metal oxide semiconductor (CMOS) transistors.

In a conventional CMOS type solid-state imaging device, a scheme of sequentially reading electric signals generated and stored by photoelectric conversion units within each of pixels arranged in a two-dimensional matrix for each row using circuit units provided on the same substrate is adopted. In a CMOS type solid-state imaging device having a general monolithic structure (a structure manufactured by a single semiconductor substrate), peripheral circuits are arranged around a pixel array unit in which a plurality of pixels for converting incident light into electric signals are formed when viewed from a surface on which light is incident. These peripheral circuits are logic circuits such as a vertical scanning circuit, a horizontal scanning circuit, a column processing circuit, an output circuit, and the like. Wiring for transferring electric signals is provided for each column or each row between the pixel array unit and these peripheral circuits.

Meanwhile, recent CMOS type solid-state imaging devices are required to improve the data rate, the identicalness of the in-plane imaging performance, the high functionality, and the like. However, in the conventional CMOS type solid-state imaging device having a monolithic structure, it is difficult to improve the performance due to the speed limit, the density limit, and so on, in electric conduction in the plane direction. Also, in recent CMOS solid-state imaging devices, size reduction is also required, but it is difficult to reduce the area of the substrate plane because the peripheral circuits are arranged around the pixel array unit.

In view of this, a CMOS type solid-state imaging device configured as a single semiconductor device in which a semiconductor substrate having a pixel array in which a plurality of pixels are arranged, and a semiconductor substrate having the peripheral logic circuits for performing signal processing and the like and the memory circuit are stacked, and each of the semiconductor substrates are electrically connected has been proposed. By stacking a plurality of semiconductor substrates in this manner, improvement in performance and functionality, and size reduction in the CMOS solid-state imaging device are implemented.

In a CMOS type solid-state imaging device having a configuration in which a plurality of semiconductor substrates are stacked, pixels arranged in a pixel array are connected to corresponding circuits via corresponding connection electrode units. In other words, in the CMOS type solid-state imaging device having a configuration in which a plurality of semiconductor substrates are stacked, one connection electrode unit is provided for each pixel. In the CMOS Type solid-state imaging device having such a configuration, it is necessary to reliably connect the connection electrode units for electrically connecting each of the semiconductor substrates. In the CMOS type solid-state imaging device, if there is a connection failure in any connection electrode unit, the signal connection between the semiconductor substrates is interrupted, and it is impossible to exchange electric signals normally. Thus, in the CMOS type solid-state imaging device, if a connection failure occurs in any connection electrode unit, a state similar to the occurrence of a defect in the pixel at the position where the connection failure has occurred.

Generally, is difficult to completely eliminate defects of pixels in a solid-state imaging device. Therefore, if a pixel is defective in the solid-state imaging device in a camera, a process of treating the pixel at this position as a defective pixel and generating (interpolating) a signal of the defective pixel using signals output by pixels positioned around the defective pixel in image processing of the defective pixel correction to be executed thereafter is performed. By performing this defective pixel correction process, defective pixels in the solid-state imaging device are allowed to a certain extent in the camera.

On the other hand, technology for reducing the probability of occurrence of defective pixels due to a connection failure of the connection electrode unit has also been disclosed. For example, in Japanese Unexamined Patent Application, First Publication No. 2012-244331, technology relating to the arrangement of electrode pads in a CMOS type solid-state imaging device, having a configuration in which a first substrate in which a plurality of pixels are arranged and a second substrate having a read unit for reading signals of pixels are stacked is disclosed. In Japanese Unexamined Patent Application, First Publication No. 2012-244331, a plurality of pixels are divided into a plurality of regions for each unit pixel cell or each cell in which a plurality of pixels are integrated, and a plurality of connection pads, each of which is common to pixels included in each of the regions into which the pixels are divided, are assigned. With this configuration, in the CMOS type solid-state imaging device disclosed in Japanese Unexamined Patent Application, First Publication No. 2012-244331, the electric connection between the first substrate and the second substrate is secured by another connection pad within the same division region even when any connection pad in the same division region is not connected. In other words, in the CMOS type solid-state imaging device disclosed in Japanese Unexamined Patent Application, First Publication No. 2012-244331, the occurrence of a defective pixel due to a connection failure of the electrode pad is avoided by providing a plurality of paths for reading signals of pixels.

SUMMARY OF INVENTION

A solid-state imaging device of a first aspect of the present invention is a solid-state imaging device having a structure in which a pixel unit having a plurality of pixel cells arranged in a two-dimensional matrix is separately formed on a plurality of semiconductor substrates and the plurality of semiconductor substrates are stacked, wherein each pixel cell has a photoelectric conversion unit that converts an incident light beam into an electric signal and outputs the electric signal, the solid-state imaging device including: a first semiconductor substrate in which a plurality of photoelectric conversion circuits, which are some circuit elements of the pixel cells including the photoelectric conversion unit, are formed in a two-dimensional matrix; a second semiconductor substrate in which a plurality of memory circuits, which are some other circuit elements of the pixel cells, are formed in a two-dimensional matrix, wherein the some other circuit elements of the pixel cells include memory units that correspond to the photoelectric conversion circuits, store electric signals output by the photoelectric conversion units, and output pixel signals according to the electric signals; and a connection electrode formed between the first semiconductor substrate and the second semiconductor substrate and electrically connected to a signal line of the photoelectric conversion circuits and a signal line of the memory circuits, wherein the pixel cells arranged in the pixel unit are divided into a plurality of pixel groups in which the pixel cells are combined so that adjacent pixel cell corresponding to the same wavelength band are not included if pixel cells corresponding to light beams of the same wavelength band are considered to be arranged on one surface, wherein the same connection electrode is shared between the photoelectric conversion circuits and between the memory circuits of the pixel cells included in the same pixel group, and wherein signal lines of the photoelectric conversion circuits and signal lines of the memory circuits of the pixel cells included in different pixel groups are connected by different connection electrodes.

According to a second aspect of the present invention, in the solid-state imaging device of the above-described first aspect, the pixel unit may have a plurality of pixel cells arranged to correspond to wavelength bands of a light beam separated into at least wavelength bauds of three types, each of the pixel groups may be configured so that a plurality of pixel sets are combined, each pixel set serving as a set of the pixel cells corresponding to at least wavelength bands of two types within the plurality of pixel cells, and pixel cells corresponding to the same wavelength band included in different pixel sets combined in the same pixel group may not be arranged at adjacent positions if the pixel cells corresponding to the same wavelength band are considered to be arranged on one surface.

According to a third aspect of the present invention, in the solid-state imaging device of the above-described first aspect, the pixel unit may include the pixel cell corresponding to a red wavelength band, the pixel cell corresponding to a green wavelength band, and the pixel cell corresponding to a blue wavelength band arrayed in a Bayer array, each of the pixel groups may be configured so that a plurality of pixel sets are combined, each pixel set serving as a set of at least pixel cells of two types among the pixel cell corresponding to the red wavelength band, the pixel cell corresponding to the green wavelength band, and the pixel cell corresponding to the blue wavelength band, and pixel cells corresponding to the same wavelength band included in different pixel sets combined in the same pixel group may not be arranged at adjacent positions if the pixel cells corresponding to the same wavelength band are considered to be arranged on one surface.

According to a fourth aspect of the present invention, in the solid-state imaging device of the above-described first aspect, the pixel unit may include a plurality of pixel cells arranged to correspond to a wavelength band of all visible light, and each of the pixel groups may be configured so that a plurality of pixel cells that are not arranged at adjacent positions are combined within the plurality of pixel cells.

According to a fifth aspect of the present invention, in the solid-state imaging device of the above-described second aspect, the pixel group may be configured so that a plurality of pixel sets arranged in a checkered shape in an arrangement of the pixel sets within the pixel unit are combined.

According to a sixth aspect of the present invention, in the solid-slate imaging device of the above-described second aspect, the pixel group may be configured so that a plurality of pixel sets arranged at alternate positions in a direction in which the pixel cells included in the pixel set are arranged in an arrangement of the pixel sets within the pixel unit are combined.

According to a seventh aspect of the present invention, in the solid-state imaging device of the above-described third aspect, the pixel group may be configured so that a plurality of pixel sets arranged in a checkered shape in an arrangement of the pixel sets within the pixel unit are combined.

According to an eighth aspect of the present invention, in the solid-state imaging device of the above-described third aspect, the pixel group may be configured so that a plurality of pixel sets arranged at alternate positions in a direction in which the pixel cells included in the pixel set are arranged in an arrangement of the pixel sets within the pixel unit are combined.

According to a ninth aspect of the present invention, in the solid-state imaging device of the above-described fourth aspect, the pixel group may be configured so that a plurality of pixel cells arranged in a checkered shape in an arrangement of the pixel cells within the pixel unit are combined.

According to a tenth aspect of the present invention, in the solid-state imaging device of the above-described fourth aspect, the pixel group may be configured so that a plurality of pixel cells arranged at alternate positions in a predetermined direction in an arrangement of the pixel cells within the pixel unit are combined.

According to an eleventh aspect of the present invention, in the solid-state imaging device of the above-described first aspect, if a connection failure of the connection electrode in any pixel group has occurred, the solid-state imaging device may interpolate the pixel signal output by each pixel cell included in the pixel group using pixel signals output by pixel cells which are included in another pixel group connected by a connection electrode different from the connection electrode in which a connection failure has occurred and which correspond to the same wavelength band arranged at an adjacent position when the pixel cells corresponding to the same wavelength band are considered to be arranged on one surface.

DESCRIPTION OF EMBODIMENTS

Figure 1:
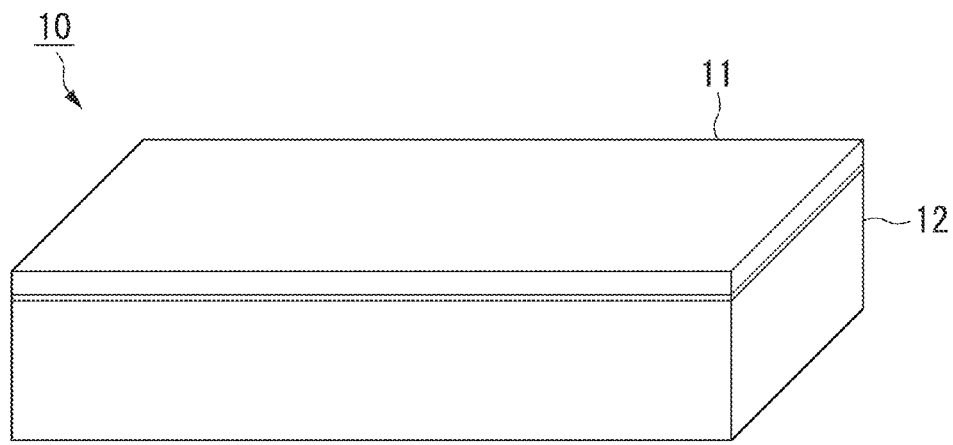
FIG. 1 is a schematic diagram showing a schematic configuration of a solid-state imaging device according to an embodiment of the present invention.

Hereinafter, embodiments of the present invention will be described with reference to the drawings. FIG. 1 is a schematic diagram showing a schematic configuration of a solid-state imaging device according to an embodiment of the present invention. The solid-state imaging device 10 according to the embodiment is configured by stacking a plurality of substrates. In FIG. 1, in the solid-state imaging device 10, a first semiconductor substrate 11 and a second semiconductor substrate 12 are bonded.

In the solid-state imaging device 10, a circuit for implementing the function of the solid-state imaging device 10 is formed on one of the first semiconductor substrate 11 and the second semiconductor substrate 12. The circuit for implementing the function of the solid-state imaging device 10 includes a pixel array unit in which pixels, each of which includes a photoelectric conversion unit such as a photodiode that converts incident light (a light beam) into an electric signal and a memory circuit that temporarily stores the electric signal obtained through the photoelectric conversion by the photoelectric conversion unit, are arranged in a two-dimensional matrix, a column processing circuit that processes the electric signal obtained through the photoelectric conversion by the photoelectric conversion unit, and a drive circuit for driving the pixels in the pixel array unit, and the like. Also, a circuit for implementing the function of the solid-state imaging device 10 includes a signal processing circuit for processing the electric signal processed by the column processing circuit, and the like.

The solid-state imaging device 10 shown in FIG. 1 has a configuration similar to that of a so-called back side irradiation (back side illumination: BSI) type solid-state imaging device in which the first semiconductor substrate 11 is bonded to the second semiconductor substrate 12 so that the surface on the light incidence side serves as a silicon layer.

Also, each circuit for implementing the function of the solid-state imaging device 10 is not limited to a configuration in which the circuit is formed on either one of the first semiconductor substrate 11 or the second semiconductor substrate 12, and may be configured to be formed on both semiconductor substrates of the first semiconductor substrate 11 and the second semiconductor substrate 12.

In the solid-state imaging device 10, an adhesive layer may be provided as a method of bonding the first semiconductor substrate 11 to the second semiconductor substrate 12, or the first semiconductor substrate 11 and the second semiconductor substrate 12 may be directly bonded. As a method of bonding the first semiconductor substrate 11 to the second semiconductor substrate 12 by providing an adhesive layer in the solid-state imaging device 10, for example, a method of bonding (stacking) the semiconductor substrates using a resin film such as a resin adhesive as an adhesive layer may be conceived. At this time, in the solid-state imaging device 10, a connection electrode unit for electrically connecting the signals of the first semiconductor substrate 11 and the second semiconductor substrate 12 may be included in the adhesive layer. Any structure such as a structure of a micro-bump, for example, fabricated by a vapor deposition method or a plating method, or a structure connected by a metallic wiring layer may be used for the connection electrode unit. Also, in the solid-state imaging device 10, for example, a structure of a through-silicon-via (TSV) may be used as the structure of the connection electrode unit.

In the solid-state imaging device 10, as a method of directly bonding the first semiconductor substrate 11 to the second semiconductor substrate 12, for example, a method of applying pre-processing to oxide films or metal parts of the semiconductor substrates, and directly bonding (stacking) the semiconductor substrates by plasma bonding based on surface activation may be conceived. At this time, even when the first semiconductor substrate 11 and the second semiconductor substrate 12 are directly bonded in the solid-slate imaging device 10, for example, a connection film such as a silicon oxide film or a silicon nitride film may be provided and used as an adhesive layer.

Also, an example in which the function of the solid-state imaging device 10 is implemented by the configuration in which the two semiconductor substrates of the first semiconductor substrate 11 and the second semiconductor substrate 12 are stacked is shown in the embodiment, but the number of semiconductor substrates to be stacked to implement the function of the solid-state imaging de vice is not limited to two, and a configuration in which a larger number of semiconductor substrates are stacked may be employed. If the solid-state imaging device 10 is configured to implement the function of the solid-state imaging device by stacking three semiconductor substrates, for example, the surface on the side of the second semiconductor substrate 12 in the first semiconductor substrate 11 shown in FIG. 1 may be bonded to the third semiconductor substrate, and the second semiconductor substrate 12 may be further bonded. That is, the solid-state imaging device 10 may have a configuration in which third and subsequent semiconductor substrates are sandwiched between the first semiconductor substrate 11 and the second semiconductor substrate 12.

Figure 2:
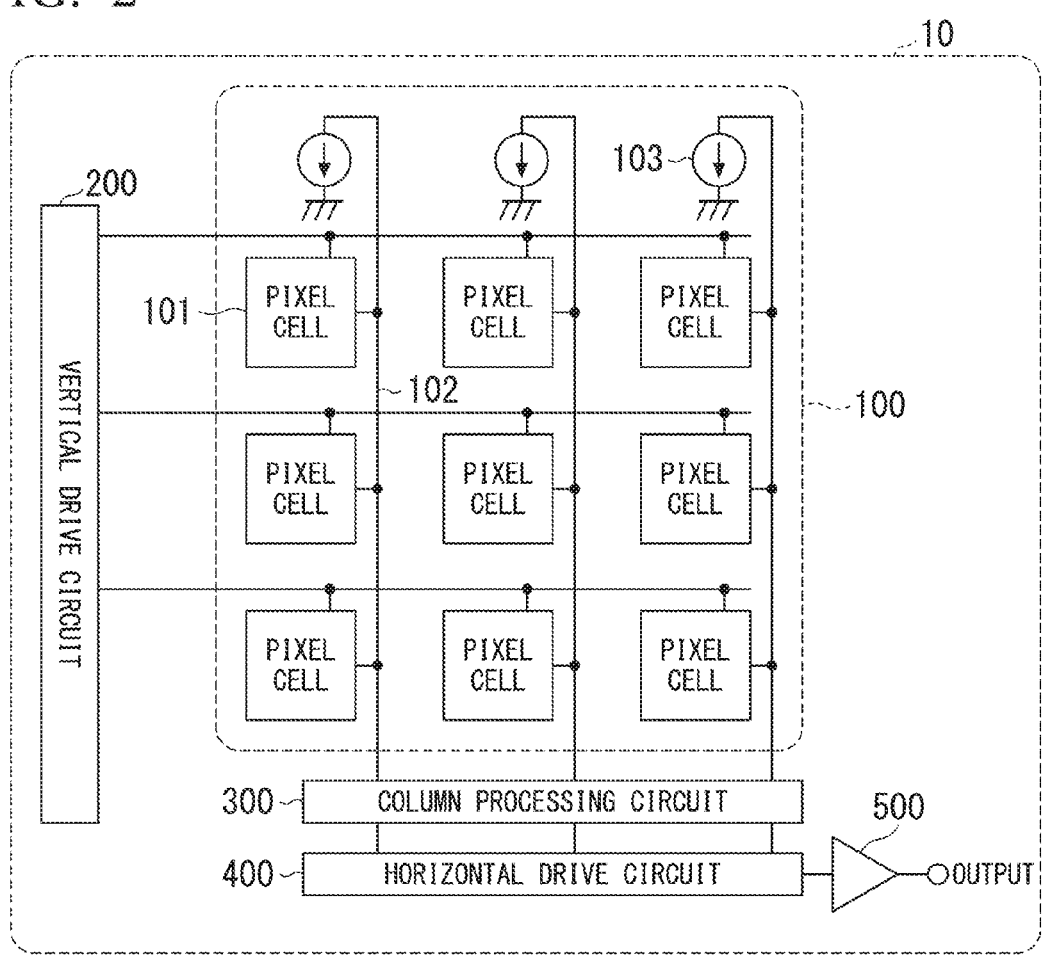
FIG. 2 is a block diagram showing a schematic configuration of the solid-state imaging device according to the embodiment of the present invention.

Next, the configuration of the solid-state imaging device 10 according to the embodiment will be described. FIG. 2 is a block diagram showing a schematic configuration of the solid-state imaging device 10 according to the embodiment of the present invention. In FIG. 2, the solid-state imaging device 10 includes a pixel array unit 100, a vertical drive circuit 200, a column processing circuit 300, a horizontal drive circuit 400, and an output unit 500.

The pixel array unit 100 is a pixel unit in which a plurality of pixel cells 101 are arranged in a two-dimensional matrix, wherein each pixel cell includes a photoelectric conversion unit that converts incident light into an electric signal, a memory unit that stores the electric signal obtained through the conversion by the photoelectric conversion unit, and a plurality of transistors. Each pixel cell 101 within the pixel array unit 100 converts incident light into an electric signal by the photoelectric conversion unit according to a drive signal input from the vertical drive circuit 200 and stores the electric signal obtained through the photoelectric conversion in the memory unit. Each pixel cell 101 within the pixel array unit 100 amplifies the electric signal stored in the memory unit according to the drive signal input from the vertical drive circuit 200, and outputs the amplified electric signal as a pixel signal to the column processing circuit 300 via the corresponding vertical signal line 102.

FIG. 2 shows an example in which the pixel cells 101 are arranged in three rows and three columns within the pixel array unit 100. FIG. 2 shows a configuration in which a vertical signal line current source 103 is connected to a vertical signal line 102 corresponding to the pixel cells 101 of each column arranged in the pixel array unit 100. The vertical signal line current source 103 is a current source having one side connected to the ground and the other side connected to the corresponding vertical signal line 102. The vertical signal line current source 103 operates as a load of a transistor of an amplifying unit included with in fee pixel cells 101 connected to the corresponding vertical signal line 102.

The vertical drive circuit 200 drives each pixel cell 101 within the pixel array unit 100, and each pixel cell 101 outputs a pixel signal according to an electric signal obtained by photoelectrically converting the incident light to the column processing circuit 300 via the corresponding vertical signal line 102. The vertical drive circuit 200 generates a drive signal for driving each pixel Cell 101 within the pixel array unit 100. Then, the vertical drive circuit 200 sequentially outputs the generated drive signal for each row of the pixel cells 101 arranged in the pixel array unit 100 to drive each pixel cell 101 within the pixel array unit 100 for each row.

The column processing circuit 300 performs predetermined processing (hereinafter referred to as "column processing") on a pixel signal output front each pixel cell 101 in the pixel array unit 100 according to driving by the vertical drive circuit 200, for each column of the pixel cells 101 arranged in the pixel array unit 100. Then, the column processing circuit 300 outputs the pixel signal after the column processing to the horizontal drive circuit 400. As the column processing to be performed by the column processing circuit 300 on the pixel signal, for example, there is analog signal processing such as an amplification process of amplifying a pixel signal, a correlated double sampling (CDS) process of performing a process such as noise removal on a pixel signal, or an analog-to-digital conversion process of performing analog-to-digital conversion on a pixel signal (an analog signal).

The horizontal drive circuit 400 sequentially outputs the pixel signals subjected to the column processing by the column processing circuit 300 to the output unit 500 for each column of the pixel cells 101 arranged in the pixel array unit 100.

The output unit 500 outputs each of the electric signals after the column processing the electric signals which are sequentially output from the horizontal drive circuit 400 for each column of the pixel cells 101 arranged in the pixel array unit 100, as an electric signal of each pixel output by the solid-state imaging device 10 to an outside the solid-state imaging device 10. The output unit 500 is constituted of for example, an output amplifier, an output buffer, and the like.

As described above, the components included in the solid-state imaging device 10, i.e., the pixel array unit 100, the vertical drive circuit 200, the column processing circuit 300, the horizontal drive circuit 400, and the output unit 500, are formed on one semiconductor substrate of the first semiconductor substrate 11 and the second semiconductor substrate 12 or both semiconductor substrates of the first semiconductor substrate 11 and the second semiconductor substrate 12.

Figure 3:
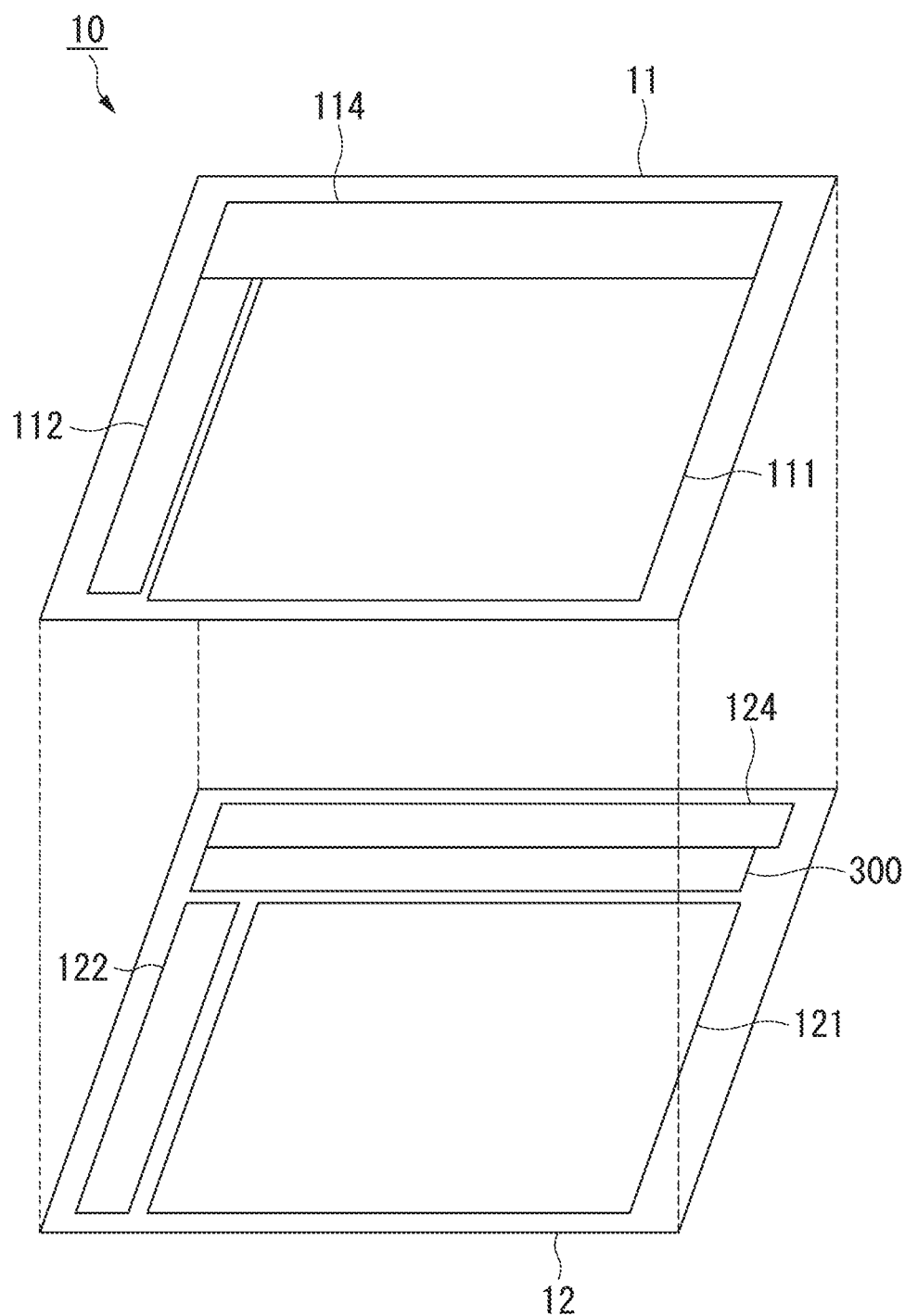
FIG. 3 is a diagram showing configurations of a first semiconductor substrate and a second semiconductor substrate in the solid-state imaging device according to the embodiment of the present invention.

Next, a configuration in which the components of the solid-state imaging device 10 according to the embodiment are formed on the first semiconductor substrate 11 and the second semiconductor substrate 12 will be described. FIG. 3 is a diagram showing the configurations of the first semiconductor substrate 11 and the second semiconductor substrate 12 in the solid-state imaging device 10 according to the embodiment of the present invention. FIG. 3 shows an example of the components within the first semiconductor substrate 11 and the components within the second semiconductor substrate 12 constituting the solid-state imaging device 10.

The first semiconductor substrate 11 is a semiconductor substrate which converts the incident light into an electric signal and outputs the electric signal to the second semiconductor substrate 12. In the first semiconductor substrate 11, a photoelectric conversion array 111, a first vertical drive circuit 112, and a first horizontal drive circuit 114 are formed. Also, in the first semiconductor substrate 11, wire bonding pads (not shown) for connecting wiring for the solid-state imaging device 10 to input and output signals to and from the outside are formed.

The wire bonding pad is a terminal connected to wiring for inputting and outputting electric signals between a circuit outside the package and the solid-state imaging device 10 when the solid-state imaging device 10 is assembled (packaged) in, for example, a ceramic package or the like. The wire bonding pad and the package are electrically connected fey a wiring unit formed using a wire bonding method or the like. The electric signal output from the solid-state imaging device 10 is output to an external circuit via the corresponding wire bonding pad and the wiring unit. An electric signal input from an external circuit is input to each component within the solid-state imaging device 10 via the corresponding wiring unit and the corresponding wire bonding pad.

The second semiconductor substrate 12 is a semiconductor substrate that processes the electric signal output from the first semiconductor substrate 11 and outputs the processed electric signal to the first semiconductor substrate 11. In the second semiconductor substrate 12, a memory array 121, a second vertical drive circuit 122, a column processing circuit 300, and a second horizontal drive circuit 124 are formed.

A photoelectric conversion array 111 is a part of the pixel unit in which a plurality of sets each including a photoelectric conversion unit and a plurality of transistors around the photoelectric conversion unit among the components included in each pixel cell 101 arranged in the pixel array unit 100 are arranged in a two-dimensional matrix. The photoelectric conversion array 111 converts the incident light into an electric signal by the photoelectric conversion unit according to the drive signal input from the first vertical drive circuit 112 and outputs the electric signal obtained by the photoelectric conversion to the memory array 121 of the second semiconductor substrate 12. In the following description, the components of the photoelectric conversion unit in one pixel cell 101 and the plurality of transistors around the photoelectric conversion unit are referred to as a "photoelectric conversion circuit 1110".

The first vertical drive circuit 112 drives each photoelectric conversion circuit 1110 within the photoelectric conversion array 111 and causes an electric signal obtained by photoelectric conversion of the incident light performed by each photoelectric conversion circuit 1110 to be output to the memory array 121. The first vertical drive circuit 112 generates a drive signal for driving each photoelectric conversion circuit 1110 within the photoelectric conversion array 111. Then, the first vertical drive circuit 112 outputs the generated drive signal to each photoelectric conversion circuit 1110 arranged in the photoelectric conversion array 111 to drive each photoelectric conversion circuit 1110 within the photoelectric conversion array 111. At this time, the first vertical drive circuit 112 drives each photoelectric conversion circuit 1110 within the photoelectric conversion array 111 according to the configuration in which the photoelectric conversion array 111 and the memory array 121 are connected. The description relating to the order of driving the photoelectric conversion circuits 1110 in the first vertical drive circuit 112 will be given below later.

The memory array 121 is a part of the pixel unit in which a plurality of sets each including a memory unit and a plurality of transistors around the memory unit among the components included in each pixel cell 101 arranged in the pixel array unit 100 are arranged in a two-dimensional matrix. The memory array 121 receives the electric signal output from each photoelectric conversion circuit 1110 within the photoelectric conversion array 111 according to the drive signal input from the second vertical drive circuit 122 and stores the electric signal in the corresponding memory unit arranged in the memory array 121. Also, the memory array 121 amplifies the electric signal stored in the memory unit according to the drive signal input from the second vertical drive circuit 122, and outputs the amplified electric signal as a pixel signal to the column processing circuit 300. In the following description, the configurations of the memory unit in one pixel cell 101 and the plurality of transistors around the memory unit are referred to as a "memory circuit 1210".

In the configuration of the solid-state imaging device 10 shown in FIG. 3, the function of the pixel array unit 100 is implemented by the photoelectric conversion array 111 and the memory array 121. Also, in the configuration of the solid-state imaging device 10 shown in FIG. 3, the function of the pixel cell 101 is implemented by the photoelectric conversion circuit 1110 and the memory circuit 1210.

The second vertical drive circuit 122 drives each memory circuit 1210 within the memory array 121 and stores the electric signal output from the photoelectric conversion array 111 according to driving by the first vertical drive circuit 112 in each memory circuit 1210. Also, the second vertical drive circuit 122 drives each memory circuit 1210 within the memory array 121, and causes the electric signal stored in each memory circuit 1210 as a pixel signal to be output to the column processing circuit 300 via the vertical signal line 102. The second vertical drive circuit 122 generates a drive signal for driving each memory circuit 1210 within the memory array 121. The second vertical drive circuit 122 sequentially outputs the generated drive signal for each row of the memory circuit 1210 arranged in the memory array 121 to drive each memory circuit 1210 within the memory array 121 for each row.

In the configuration of the solid-state imaging device 10 shown in FIG. 3, the function of the vertical drive circuit 200 is implemented by the first vertical drive circuit 112 and the second vertical drive circuit 122. Thus, the first vertical chive circuit 112 and the second vertical drive circuit 122 synchronize at least the timing at which the first vertical drive circuit 112 drives each photoelectric conversion circuit 1110 to cause an electric signal obtained by photoelectric conversion to be output and the timing at which the second vertical drive circuit 122 drives each of the memory circuits 1210 to cause the memory circuit 1210 to store the electric signal.

The column processing circuit 300 performs predetermined column processing on the pixel signal output from the memory array 121 according to driving by the second vertical drive circuit 122 for each column of the memory circuits 1210 arranged in the memory array 121, i.e., each column of the pixel cells 101 arranged in the pixel array unit 100. Therefore, the column processing circuit 300 outputs the pixel signal after the column processing to the second horizontal drive circuit 124.

The second horizontal drive circuit 124 sequentially outputs pixel signals after the column processing output from the column processing circuit 300 to the first horizontal drive circuit 114 for each column of the memory circuits 1210 arranged in the memory array 121, i.e., each column of the pixel cells 101 arranged in the pixel array unit 100.

The first horizontal drive circuit 114 sequentially outputs the pixel signals after the column processing sequentially output from the second horizontal drive circuit 124 to the output unit 500 (not shown) and causes the pixel signals to be output as electric signals of pixels output from the solid-state imaging device 10 outside the solid-state imaging device 10.

In the configuration of the solid-state imaging device 10 shown in FIG. 3, the function of the horizontal drive circuit 400 is implemented by the second horizontal drive circuit 124 and the first horizontal drive circuit 114. Each of the first horizontal drive circuit 114 and the second horizontal drive circuit 124 may have a function for separately testing each of the semiconductor substrates before the first semiconductor substrate 11 and the second semiconductor substrate 12 are stacked, for example, in a manufacturing process of the solid-state imaging device 10. For example, the first horizontal drive circuit 114 may have a function of causing electric signals output by the photoelectric conversion circuits 1110 to be sequentially externally output for each column of the photoelectric conversion circuits 1110 arranged in the photoelectric conversion array 111, i.e., each column of the pixel cells 101 arranged in the pixel array unit 100. Also, for example, the second horizontal drive circuit 124 may have a function of causing electric signals stored in the memory circuit 1210 to be sequentially externally output for each column of the memory circuits 1210 arranged in the memory array 121.

As described above, in the solid-state imaging device 10, the components are separately formed on the first semiconductor substrate 11 and the second semiconductor substrate 12. In the solid-state imaging device 10, the components formed on the semiconductor substrates of the first semiconductor substrate 11 and the second semiconductor substrate 12 are electrically connected by the corresponding connection electrode units.

In the configuration of the solid-state imaging device 10 shown in FIG. 3, a case in which the vertical drive circuit 200 and the horizontal drive circuit 400 are separately formed on the first semiconductor substrate 11 and the second semiconductor substrate 12 is shown. That is, in the configuration of the solid-state imaging device 10 shown in FIG. 3, the vertical drive circuit 200 is divided into the first vertical drive circuit 112 and the second vertical drive circuit 122 to be formed on the semiconductor substrates, and the horizontal drive circuit 400 is divided into the first horizontal drive circuit 114 and the second horizontal drive circuit 124 to be formed on the semiconductor substrates. However, the vertical drive circuit 200 and the horizontal drive circuit 400 may be formed on one of the first semiconductor substrate 11 and the second semiconductor substrate 12.

Also, in the configuration of the solid-state imaging device 10 shown in FIG. 3, a case in which all the photoelectric conversion circuits 1110 provided in each pixel cell 101 arranged in the pixel array unit 100 are formed on the first semiconductor substrate 11 and all the memory circuits 1210 are formed on the second semiconductor substrate 12 is shown. However, the photoelectric con version circuits 1110 and the memory circuits 1210 are not limited to a configuration in which the photoelectric conversion circuits 1110 or the memory circuits 1210 are formed on one of the first semiconductor substrate 11 and the second semiconductor substrate 12, and may be separately formed on both the first semiconductor substrate 11 and the second semiconductor substrate 12.

Also, in the description of the solid-state imaging device 10 shown in FIG. 3, the configuration in which the wire bonding pad is formed on the first semiconductor substrate 11 has been described. However, the wire bonding pad may be not only arranged on the first semiconductor substrate 11, but also formed on the second semiconductor substrate 12.

Figure 4:
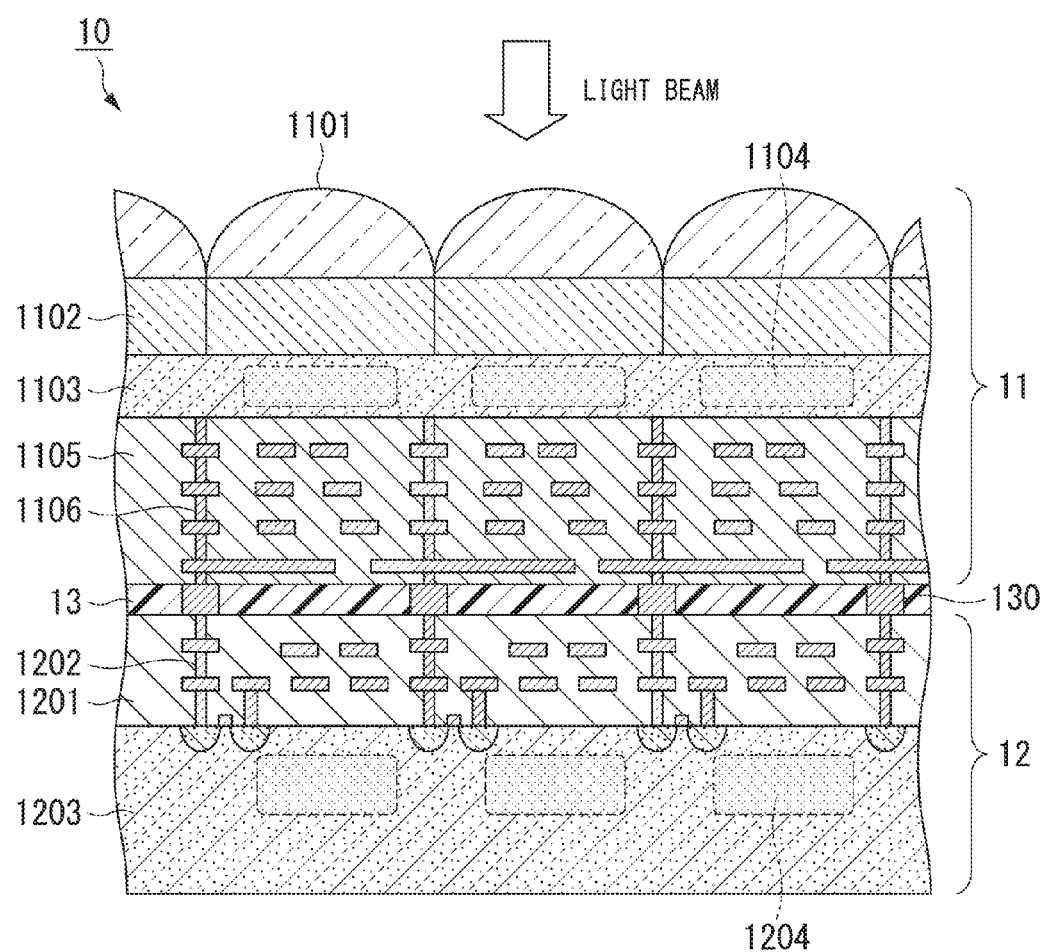
FIG. 4 is a cross-sectional view showing a structure of the solid-state imaging device according to the embodiment of the present invention.

Next, the structure of the solid-state imaging device 10 according to the embodiment will be described. FIG. 4 is a cross-sectional view showing the structure of the solid-state imaging device 10 according to the embodiment of the present invention. FIG. 4 shows a part of a structure of a region in which the pixel cells 101 within the pixel array unit 100 are formed in the configuration of the solid-state imaging device 10 shown in FIG. 3. That is, FIG. 4 shows a structure for connecting the photoelectric conversion circuits 1110 arranged in the photoelectric conversion array 111 and the corresponding memory circuits 1210 arranged in the memory array 121. As described above, the first semiconductor substrate 11 and the second semiconductor substrate 12 are bonded in the solid-state imaging device 10, but an example in which the substrates are bonded by a connection layer in the structure of the solid-state imaging device 10 shown in FIG. 4 is shown.

The first semiconductor substrate 11 includes a microlens 1101, a color filter 1102, a first semiconductor layer 1103, and a first wiring layer 1105. The first semiconductor substrate 11 has a configuration similar to that of a back side illumination type solid-state imaging device in which circuit elements (a photoelectric conversion unit and a plurality of transistors around the photoelectric conversion unit) of the photoelectric conversion circuit 1110 for converting the light beam incident on the solid-state imaging device 10 into an electric signal are formed.

Also, the second semiconductor substrate 12 is constituted of a second wiring layer 1201 and a second semiconductor layer 1203. In the second semiconductor substrate 12, circuit elements (a memory unit and a plurality of transistors around the memory unit) of the memory circuit 1210 for storing the electrical signal output from the photoelectric conversion circuit 1110 in the solid-state imaging device 10 are formed.

Also, the fest semiconductor substrate 11 and the second semiconductor substrate 12 are bonded by the connection layer 13. Within the connection layer 13, a connection electrode unit 130 for electrically connecting the photoelectric conversion circuit 1110 formed on the first semiconductor substrate 11 and the corresponding memory circuit 1210 formed on the second semiconductor substrate 12 is formed.

The microlens 1101 concentrates light (a light beam) incident on the solid-state imaging device 10. The microlens 1101 is formed at a position corresponding to the photoelectric conversion unit provided in each pixel cell 101 arranged in the solid-state imaging device 10, i.e., the photoelectric conversion circuit 1110. Then, the microlens 1101 concentrates the incident light beam onto, for example, the photoelectric conversion unit formed on the first semiconductor layer 1103.

The color filter 1102 causes fight beams of different wavelength bands (colors) to be incident for each pixel cell 101 formed directly below by changing spectral transmission characteristics of light (a light beam) incident on the solid-state imaging device 10. The color filter 1102 is, for example, a Bayer array color filter. The color filter 1102 is formed at a position corresponding to each of the microlens 1101 and the pixel cell 101. Also, the color filter 1102 is provided as necessary. For example, if the solid-state imaging device 10 is a solid-state imaging device that forms a monochrome image, it is not necessary to provide the color filter 1102.

The first semiconductor layer 1103 is a semiconductor layer in which circuit elements of the photoelectric conversion circuit 1110 (a photoelectric conversion unit and a plurality of transistors around the photoelectric conversion unit) or circuit elements of each components arranged within the first semiconductor substrate 11 (the photoelectric conversion array 111, the first vertical drive circuit 112, and the first horizontal drive circuit 114) are formed. In the configuration of the solid-state imaging device 10 shown in FIG. 4, a case in which the photoelectric conversion unit 1104 that is a circuit element of the photoelectric conversion circuit 1110 that converts light (a light beam) of a wavelength band (color) concentrated by the microlens 1101 and separated by the color filter 1102 into an electric signal is formed within the first semiconductor layer 1103 is shown.

Also, a transparent resin layer for flattening a surface on which light (a light beam) is incident on the first semiconductor substrate 11 or a light shielding film constituted of a lattice-like metallic material to shield light between adjacent pixel cells 101 and formed of a plurality of layers using, for example, tungsten or aluminum, as a main material and using titanium or a nitride thereof as an adhesion layer may be formed between the color filter 1102 and the first semiconductor layer 1103. Also, an antireflection film formed by a high dielectric material or formed on a surface in contact with the first semiconductor layer 1103 in a single layer or a plurality of layers using, for example, tantalum oxide, hafnium oxide, or silicon nitride may be formed to reduce the reflection of light (a light beam) incident on the solid-state imaging device 10 between the color filter 1102 and the first semiconductor layer 1103. At this time, the antireflection film is formed so that an incident light beam is spectrally separated by predetermined spectral transmission characteristics and light beams of different wavelength bands (colors) are incident on the first semiconductor layer 1103.

The first wiring layer 1105 is a layer in which metallic wiring that connects the circuit elements of the photoelectric conversion circuit 1110 or the components arranged within the first semiconductor substrate 11 is formed. In the configuration of the solid-state imaging device 10 shown in FIG. 4, a case in which metallic wiring 1106 is formed within the first wiring layer 1105 is shown. In the configuration of the solid-state imaging device 10 shown in FIG. 4, the circuit elements constituting the components arranged in the first semiconductor substrate 11 are connected by metallic wiring 1106 formed within the first wiring layer 1105.

The connection layer 13 is a layer for bonding the first semiconductor substrate 11 to the second semiconductor substrate 12. The connection layer 13 is constituted of for example, a silicon oxide film or a silicon nitride film. Within the connection layer 13, a connection electrode unit 130 for electrically connecting the circuit elements constituting the components arranged in the first semiconductor substrate 11 and the circuit elements constituting the components arranged in the second semiconductor substrate 12 is formed. In the configuration of the solid-state imaging device 10 shown in FIG. 4, the electric signal obtained through photoelectric conversion by the photoelectric conversion unit 1104 formed within the first semiconductor layer 1103 is output (transmitted) to the memory circuit 1210 formed within the second semiconductor layer 1203 of the second semiconductor substrate 12 via the connection electrode unit 130.

The second wiring layer 1201 is a layer in which metallic wiring that connects the circuit elements of the memory circuit 1210 or the components arranged within the second semiconductor substrate 12 (the memory array 121, the second vertical drive circuit 122, the column processing circuit 300, and the second horizontal drive circuit 124) is formed. In the configuration of the solid-state imaging device 10 shown in FIG. 4, a case in which the metallic wiring 1202 is formed within the second wiring layer 1201 is shown. In the configuration of the solid-state imaging device 10 shown in FIG. 4, the circuit elements constituting the components arranged in the second semiconductor substrate 12 are connected by the metallic wiring 1202 formed within the second wiring layer 1201.

The second semiconductor layer 1203 is a semiconductor layer in which circuit element of the memory circuit 1210 (a memory unit and a plurality of transistors around the memory unit) or circuit elements of each components arranged within the second semiconductor substrate 12 are formed. In the configuration of the solid-state imaging device 10 shown in FIG. 4, a case in which the memory unit 1204 that is a circuit element of the memory circuit 1210 for storing an electric signal output (transmitted) from the photoelectric conversion unit 1104 provided in the corresponding photoelectric con version circuit 1110 via the connection electrode unit 130 is formed within the second semiconductor layer 1203 is shown.

Figure 5:
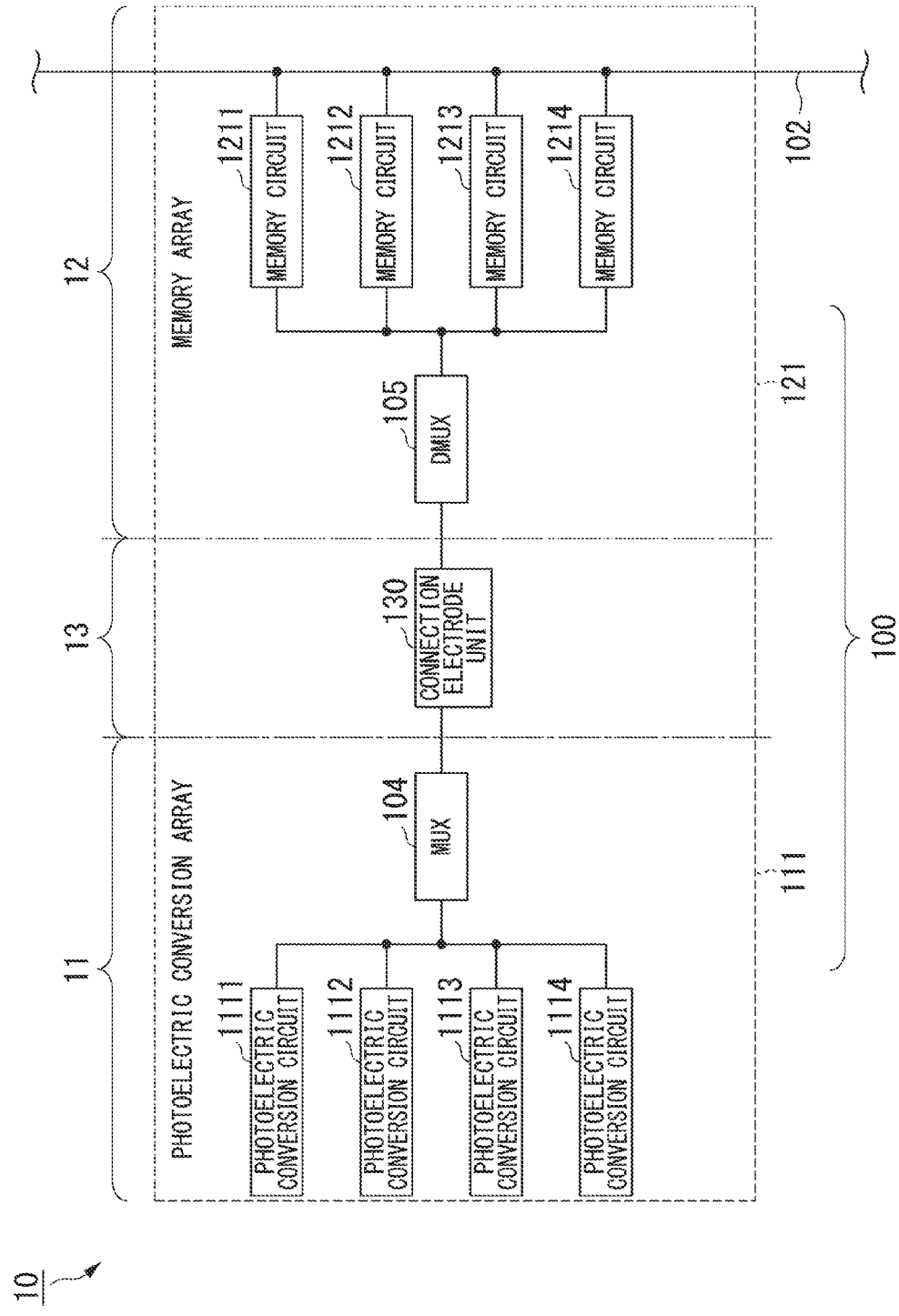
FIG. 5 is a block diagram showing an example of a configuration for connecting components formed on the first semiconductor substrate and the second semiconductor substrate are connected in the solid-state imaging device according to the embodiment of the present invention.

Next, a method of connecting and driving components of the pixel array unit 100 separately formed on the first semiconductor substrate 11 and the second semiconductor substrate 12 in the solid-state imaging device 10 according to the embodiment will be described. FIG. 5 is a block diagram showing an example of a configuration for connecting the components formed on the first semiconductor substrate 11 and the second semiconductor substrate 12 in the solid-state imaging device 10 according to the embodiment of the present invention.

When a plurality of pixel cells 101 arranged within the pixel array unit 100 are designated as one pixel group in the solid-state imaging device 10 and the pixel cells 101 included in the pixel group are separately formed on the first semiconductor substrate 11 and the second semiconductor substrate 12, the pixel cells 101 included in the pixel group share the same connection electrode unit. That is, one connection electrode unit is shared by a plurality of photoelectric conversion circuits 1110 and a plurality of memory circuits 1210 into which the pixel cells 101 included in the pixel group are divided in the solid-state imaging device 10. Thereby, in the solid-state imaging device 10, it is possible to reduce a path of an electric signal output from the photoelectric conversion, circuit 1110 formed on the first semiconductor substrate 11 to the memory circuit 1210 formed on the second semiconductor substrate 12, i.e., it is possible to reduce the number of connection electrode units 130 that electrically connect the first semiconductor substrate 11 and the second semiconductor substrate 12. Thereby, in the solid-state imaging device 10, it is possible to reduce the probability of a connection failure in the connection electrode unit 130.

In the example shown in FIG. 5, a configuration in which four pixel cells 101 arranged in the pixel array unit 100 we designated as one pixel group and four photoelectric conversion circuits 1110 (photoelectric conversion circuits 1111 to 1114) and four memory circuits 1210 (memory circuits 1211 to 1214) formed by dividing the four pixel cells 101 on the first semiconductor substrate 11 and the second semiconductor substrate 12 share one connection electrode unit 130 is shown. In the example shown in FIG. 5, the number of connection electrode units 130 is ¼ as compared with the case in which the photoelectric con version circuits 1110 and the memory circuits 1210 are connected one by one. Thereby, in the solid-state imaging device 10, the probability of a connection failure in the connection electrode unit 130 can be reduced to ¼.

Due to this configuration, in the solid-state imaging device 10, electric signals output from the four photoelectric conversion circuits 1110 formed on the first semiconductor substrate 11 are sequentially output (transmitted) to the four corresponding memory circuits 1210 formed on the second semiconductor substrate 12 via one shared connection electrode unit 130 formed within the connection layer 13.

In the solid-state imaging device 10, a multiplexer (MUX) 104 and a demultiplexer (DMUX) 105 are provided as components for sequentially outputting (transmitting) the electric signals output from the photoelectric conversion circuits 1110 to the corresponding memory circuits 1210 within the pixel array unit 100. More specifically, in the solid-state imaging device 10, the multiplexer 104 is provided within the first semiconductor substrate 11 and the demultiplexer 105 is provided within the Second semiconductor substrate 12. In the solid-state imaging device 10, the first vertical drive circuit 112 drives the photoelectric conversion circuit 1110 and controls the multiplexer 104, and the second vertical drive circuit 122 drives the memory circuit 1210 and controls the demultiplexer 105. At this time, in the solid-state imaging device 10, the timing at winch the first vertical drive circuit 112 controls the multiplexer 104 and the timing at which the second vertical drive circuit 122 controls the demultiplexer 105 are synchronized.

More specifically in the example shown in FIG. 5, the photoelectric conversion circuit 1111 corresponds to the memory circuit 1211, the photoelectric conversion circuit 1112 corresponds to the memory circuit 1212, the photoelectric con version circuit 1113 corresponds to the memory circuit 1213, and the photoelectric conversion circuit 1214 corresponds to the memory circuit 1214. That is, in the example shown in FIG. 5, one pixel cell 101 is constituted of die photoelectric conversion circuit 1111 and the memory circuit 1211, another one pixel cell 101 is constituted of the photoelectric conversion circuit 1112 and the memory circuit 1212, still another one pixel cell 101 is constituted of the photoelectric conversion circuit 1113 and the memory circuit 1213, and still another one pixel cell 101 is constituted of the photoelectric conversion circuit 1114 and the memory circuit 1214.

First, the first vertical drive circuit 112 controls the multiplexer 104 so that the photoelectric conversion circuit 1111 and the connection electrode unit 130 are connected, and the second vertical drive circuit 122 controls the demultiplexer 105 so that the connection electrode unit 130 and the memory circuit 1211 are connected. Thus, in the solid-state imaging device 10, first, the electric signal output from the photoelectric conversion circuit 1111 is output (transmitted) to the memory circuit 1211 via the multiplexer 104, the connection electrode unit 130, and the demultiplexer 105. Subsequently, the first vertical drive circuit 112 controls the multiplexer 104 so that the photoelectric conversion circuit 1112 and the connection electrode unit 130 are connected, and the second vertical drive circuit 122 controls the demultiplexer 105 so that the connection electrode unit 130 and the memory circuit 1212 are connected. Thereby, in the solid-state imaging device 10, next, the electric signal output from the photoelectric conversion circuit 1112 is output (transmitted) to the memory circuit 1212 via the multiplexer 104, the connection electrode unit 130, and the demultiplexer 105.

Thereafter, likewise, the first vertical drive circuit 112 controls the multiplexer 104 so that the photoelectric conversion circuit 1113 or the photoelectric conversion circuit 1114 and the connection electrode unit 130 are connected, and the second vertical drive circuit 122 controls the demultiplexer 105 so that the connection electrode unit 130 and the memory circuit 1213 or the memory circuit 1214 are connected. Thereby, in the solid-state imaging device 10, likewise, the electric signal output from the photoelectric conversion circuit 1113 is sequentially output (transmitted) to the memory circuit 1213, and the electric signal output from the photoelectric conversion circuit 1114 is sequentially output (transmitted) to the memory circuit 1214.

In this manner, in the solid-state imaging device 10, the plurality of photoelectric conversion circuits 1110 and the plurality of memory circuits 1210 constituting the plurality of pixel cells 101 arranged within the pixel array unit 100 share the same connection electrode unit 130.

Also, in the example shown in FIG. 5, a case in which four pixel cells 101 are arranged in the pixel array unit 100, and four photoelectric conversion circuits 1110 and four memory circuits 1210 formed separately for the first semiconductor substrate 11 and the second semiconductor substrate 12 share one connection electrode unit 130 has been described. However, the number of photoelectric conversion circuits 1110 and the number of memory circuits 1210 sharing the one connection electrode unit 130 in the solid-state imaging device 10 are not limited to the example shown in FIG. 5, i.e., four, and more photoelectric conversion circuits 1110 and more memory circuits 1210 may be configured to share one connection electrode unit 130.

(First Combination Method)

Next, a combination of pixel cells 101 included in one pixel group in the solid-state imaging device 10 according to the embodiment will be described. The pixel cells 101 included in the pixel group are combined to prevent the pixel cells 101 adjacent in the column direction or the row direction, i.e., the pixel cells 101 of the same color consecutive in the same column or row direction, from being included in the same pixel group if the pixel cells 101 corresponding to the same wavelength band (color) are considered to be arranged on one surface in the solid-state imaging device 10.

Figure 6A:
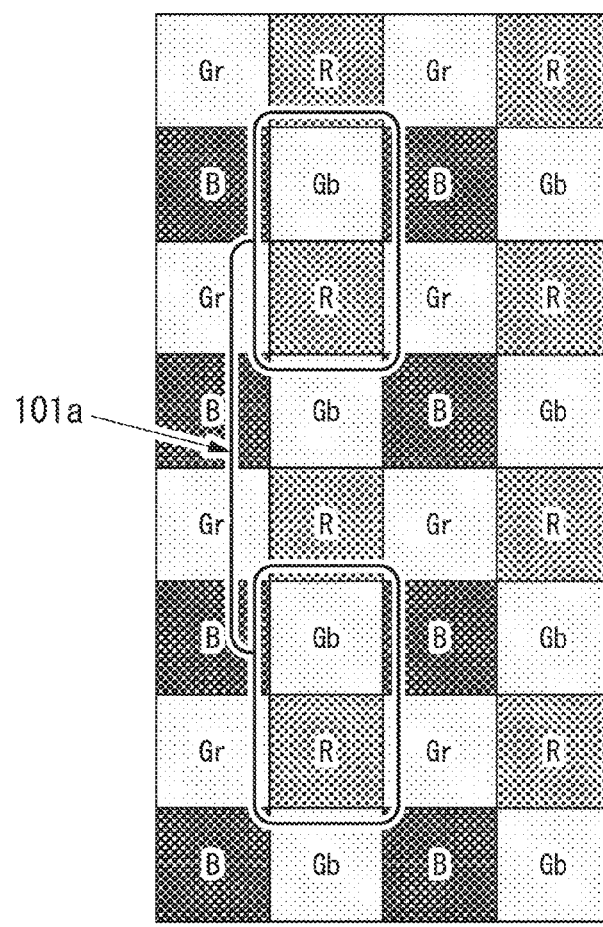
FIG. 6A is a diagram showing an example of a first combination method of pixel cells included in one pixel group in the solid-state imaging device according to the embodiment of the present invention.
Figure 6B:
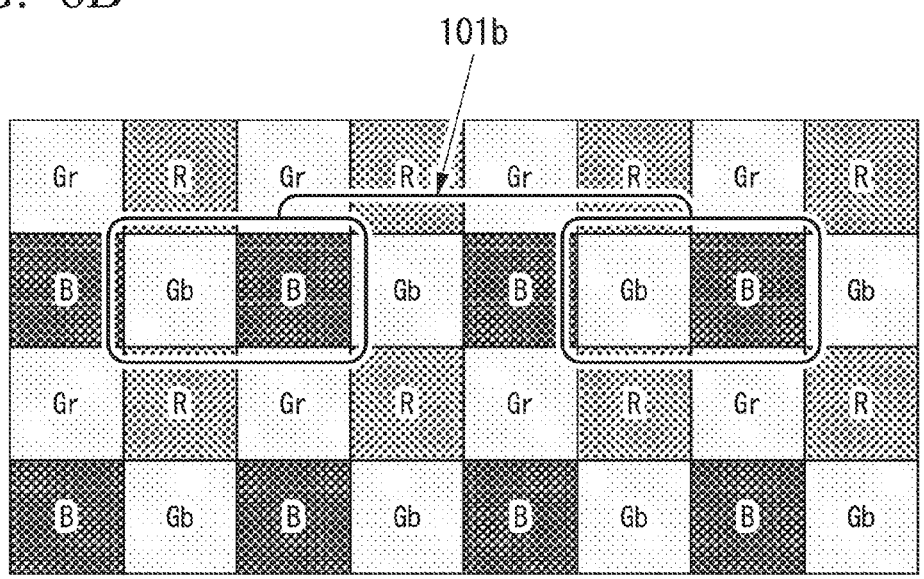
FIG. 6B is a diagram showing another example of a first combination method of pixel cells included in one pixel group in the solid-state imaging device according to the embodiment of the present invention.

FIGS. 6A and 6B are diagrams showing an example of the first combination method of the pixel cells 101 included in one pixel group in the solid-state imaging device 10 according to the embodiment of the present invention. FIGS. 6A and 6B show an example of a combination of the pixel cells 101 of the pixel group when one pixel group is constituted of four pixel cells 101 when the solid-state imaging device 10 to which the Bayer array color filter 1102 is attached is viewed from the side on which light is incident.

Also, "Gr," "R," "Gb," and "B" shown in FIGS. 6A and 6B represent wavelength bands of light (a light beam) separated by the Bayer array color filter 1102. Here, "Gr" and "Gb" represent positions of pixel cells 101 to which the color filter 1102 having spectral transmission characteristics for transmitting the green wavelength band of visible light is attached. Likewise, "R" represents a position of a pixel cell 101 to which the color filter 1102 having spectral transmission characteristics for transmitting the red wavelength band in visible light is attached, and "B" represents a position of a pixel cell 101 to which the color filter 1102 having spectral transmission characteristics for transmitting the blue wavelength band in visible light is attached.

The first combination method is a combination method of designating two pixel cells 101 arranged in the same column or row within the pixel array unit 100 as one pixel set, selecting a plurality of pixel sets at alternate positions (at the positions of skipping one pixel set) in a direction in which the pixel cells 101 are arranged within the pixel set, and configuring the plurality of selected pixel sets as one pixel group. In FIG. 6A, a combination method when two pixel cells 101 arranged in the same column within the pixel array unit 100 are designated as one pixel set and two pixel sets located at alternate positions in the column direction are configured as one pixel group is shown. That is, FIG. 6A shows a combination method when four pixel cells 101 arranged in the same column within the pixel array unit 100 are configured as one pixel group. Also, FIG. 6B shows a combination method when two pixel cells 101 arranged in the same row within the pixel array unit 100 are designated as one pixel set and two pixel sets at alternate positions in the row direction are configured as one pixel group. That is, FIG. 6B shows a combination method when four pixel cells 101 arranged in the same row within the pixel array unit 100 are configured as one pixel group.

First, a case in which four pixel cells 101 arranged in the same column are configured as one pixel group will be described with reference to FIG. 6A. If the four pixel cells 101 arranged in the second column of the pixel array unit 100 are configured as one pixel group in the first combination method, first, as shown in FIG. 6A, the Gb pixel cell 101 of the second row and the R pixel cell 101 of the third row are combined as one pixel set, and the Gb pixel cell 101 of the sixth row and the R pixel cell 101 of the seventh row are combined as another one pixel set. Then, the pixel sets are combined to configure one pixel group 101a. As described above, the combination of the pixel group 101a is a combination of pixel cells 101 configured to prevent pixel cells 101 of the same color adjacent in the column direction or the row direction from being included in the same pixel group 101a if the pixel cells 101 corresponding to the same wavelength band (color) are considered to be arranged on one surface.

Even when a connection failure occurs in the connection electrode unit 130 shared by the pixel group 101a and the pixel cell 101 included in the pixel group 101a becomes a defective pixel in the solid-state imaging device 10, it is possible to perform a process of generating (interpolating) a pixel signal of the pixel cell 101 included in the pixel group 101a on the basis of pixel signals of surrounding pixel cells 101 included in another pixel group, i.e., a pixel group sharing a different connection electrode unit 130, through the combination in such a manner. That is, a camera equipped with the solid-state imaging device 10 can generate an image without failing.

More specifically, for example, the R pixel cell 101 is considered. If the pixel cells 101 corresponding to the red wavelength band are considered to be arranged on one surface, the pixel cells 101 adjacent to the R pixel cell 101 of the third row shown in FIG. 6A are the R pixel cell 101 of the first row and the R pixel cell 101 of the fifth row. In the solid-state imaging device 10, even when a connection failure occurs in the connection electrode unit 130 shared by the R pixel cells 101 of the third row and the R pixel cells 101 of the third row become detective pixels, it is possible to generate (interpolate) the pixel signal of the R pixel cell 101 of the third row on the basis of pixel signals of these pixel cells 101 if the R pixel cell 101 of the first row and the R pixel cell 101 of the fifth row are not defective pixels. That is, by the image processing of the defective pixel correction in the camera equipped with the solid-state imaging device 10, it is possible to generate (interpolate) a pixel signal of the R pixel cell 101 of the third row serving as the defective pixel from the pixel signal of the R pixel cell 101 of the first row and the pixel signal of the R pixel cell 101 of the fifth row. Likewise, in the solid-state imaging device 10, the R pixel cell 101 of the seventh row sharing the connection electrode unit 130 with the R pixel cell 101 of the third row can also generate (interpolate) a pixel signal on the basis of pixel signals of the R pixel cell 101 of the fifth row and the R pixel cell 101 of the ninth row (not shown).

In the above-described generation (interpolation) of the pixel signal of the R pixel cell 101 of the third row, for example, if the pixel cells 101 corresponding to the red wavelength band are considered to be arranged on one surface, pixel signals of the R pixel cells 101 adjacent in the same row, i.e., the R pixel cell 101 of the 0th column (not shown) in the third row and the R pixel cell 101 of the fourth column in the third row, may be used in a defective cell correction process. Also, in the above-described generation (interpolation) of the pixel signal of the R pixel cell 101 of the third row, for example, if the pixel cells 101 corresponding to the red wavelength band are considered to be arranged on one surface, pixel signals of the R pixel cells 101 adjacent in an oblique direction, i.e., the R pixel cell 101 of the 0th column (not shown) in the first row, the R pixel cell 101 of the 0th column (not shown) in the fifth row; the R pixel cell 101 of the fourth column in the first row, and the R pixel cell 101 of the fourth column in the fifth row, may be used in a device cell correction process.

Also, here, a configuration for generating (interpolating) a pixel signal of a defective pixel according to image processing of defective pixel correction to be executed by the camera (the imaging apparatus) equipped with the solid-state imaging device 10 later if the connection electrode unit 130 shared by any pixel group has a connection failure and a pixel cell 101 included in this pixel group becomes a defective pixel has been described. However, the present invention is not limited to a configuration in which the process of correcting defective pixels is performed by the camera equipped with the solid-state imaging device 10. For example, a processing unit that performs a process of defective pixel correction may be provided within the solid-state imaging device 10, and the solid-state imaging device 10 that externally outputs a pixel signal on which the defective pixel correction process has been performed by the processing unit, i.e., an interpolated pixel signal, may be configured. Also, the defective pixel correction process may be performed by the column processing circuit 300 or the horizontal drive circuit 400.

Next, a case in which four pixel cells 101 arranged in the same row are configured as one pixel group will be described with reference to FIG. 6B. If the four pixel cells 101 arranged in the second row of the pixel array unit 100 are configured as one pixel group in the first combination method, first as shown in FIG. 6B, the Gb pixel cell 101 of the second column and the B pixel cell 101 of the third column are combined as one pixel set, and the Gb pixel cell 101 of the sixth column and the B pixel cell 101 of the seventh column are combined as another one pixel set. Then, the pixel sets are combined to configure one pixel group 101b. Similar to the combination shown in FIG. 6A, the combination of the pixel group 101b is also a combination of pixel cells 101 configured to prevent pixel cells 101 of the same color adjacent in the column direction or the row direction from being included in the same pixel group 101b if the pixel cells 101 corresponding to the same wavelength band (color) are considered to be arranged on one surface.

Even when a connection failure occurs in the connection electrode unit 130 shared by the pixel group 101b and the pixel cells 101 included in the pixel group 101b become a defective pixels in the solid-state imaging device 10, it is possible to perform a process of generating (interpolating) a pixel signal of a pixel cell 101 included in the pixel group 101b as in the combination shown in FIG. 6A through the combination in such a manner. More specifically, in the solid-state imaging device 10, for example, even when the B pixel cell 101 of the third column becomes a defective pixel, it is possible to generate (interpolate) the pixel signal of the B pixel cell 101 of the third column on the basis of the pixel signal of the B pixel cell 101 of the first column and the pixel signal of the B pixel cell 101 of the fifth column. Likewise, in the solid-state imaging device 10, the B pixel cell 101 of the seventh column sharing the connection electrode unit 130 with the B pixel cell 101 of the third column can also generate (interpolate) a pixel signal on the basis of pixel signals of the B pixel cell 101 of the fifth column and the B pixel cell 101 of the ninth column (not shown).

Here, defective pixel correction in a conventional solid-state imaging device will be considered. In the conventional solid-state imaging device, when the Gb pixel cell 101 of the second row, the R pixel cell 101 of the third row, the Gb pixel cell 101 of the fourth row, and the R pixel cell 101 of the fifth row shown in FIG. 6A are combined as one pixel group, the R pixel cell 101 of the third row and the R pixel cell 101 of the fifth row become defective pixels at the same time if a connection failure occurs in the connection electrode unit 130 shared by this pixel group. Thus, in the conventional solid-suite imaging device, it is impossible to generate (interpolate) pixel signals of the R pixel cells 101 adjacent in the same second column according to the image processing of the defective pixel correction if the R pixel cell 101 of the third row and the R pixel cell 101 of the fifth row, i.e., the pixel cells 101 corresponding to the red wavelength band, are considered to be arranged on one surface.

In this manner, in terms of a plurality of pixel cells 101 arranged within the pixel array unit 100 in the solid-state imaging device 10, one pixel group is constituted of pixel cells 101 included in a plurality of pixel sets obtained by alternately selecting pixel sets in the same direction, which include a plurality of sets of two pixel cells 101 adjacent in the column direction and the row direction, i.e., pixel cells 101 arranged in the same column or row, according to the first combination method. Thereby, even when a connection failure occurs in the connection electrode unit 130 shared by any pixel group in the solid-state imaging device 10, it is possible to easily generate (interpolate) a pixel signal of the pixel cell 101 serving as the defective pixel in image processing for defective pixel correction to be executed later. Thereby, in the imaging apparatus equipped with the solid-state imaging device 10, it is possible to limit a degradation in image quality without causing a process of generating an image to fail due to defective pixels. Thus, the probability of the solid-state imaging device 10 being treated as a defective product can be reduced, i.e., it is possible to reduce the defect rate of the solid-state imaging device 10. Thereby, the cost of the solid-state imaging device 10 can be reduced.

If the solid-state imaging device 10 is a solid-state imaging device that forms a monochrome image without the color filter 1102 attached thereto, a pixel group is configured without configuring a pixel set because the pixel cells 101 corresponding to the same wavelength band (color) are arranged on one surface of the pixel army unit 100. Accordingly in the case of a solid-state imaging device which forms a monochrome image, the plurality of pixel cells 101 arranged in the same column or row constituting one pixel group in the first combination method are pixel cells 101 arranged at alternate positions in the same column or row.

(Second Combination Method)

Figure 7:
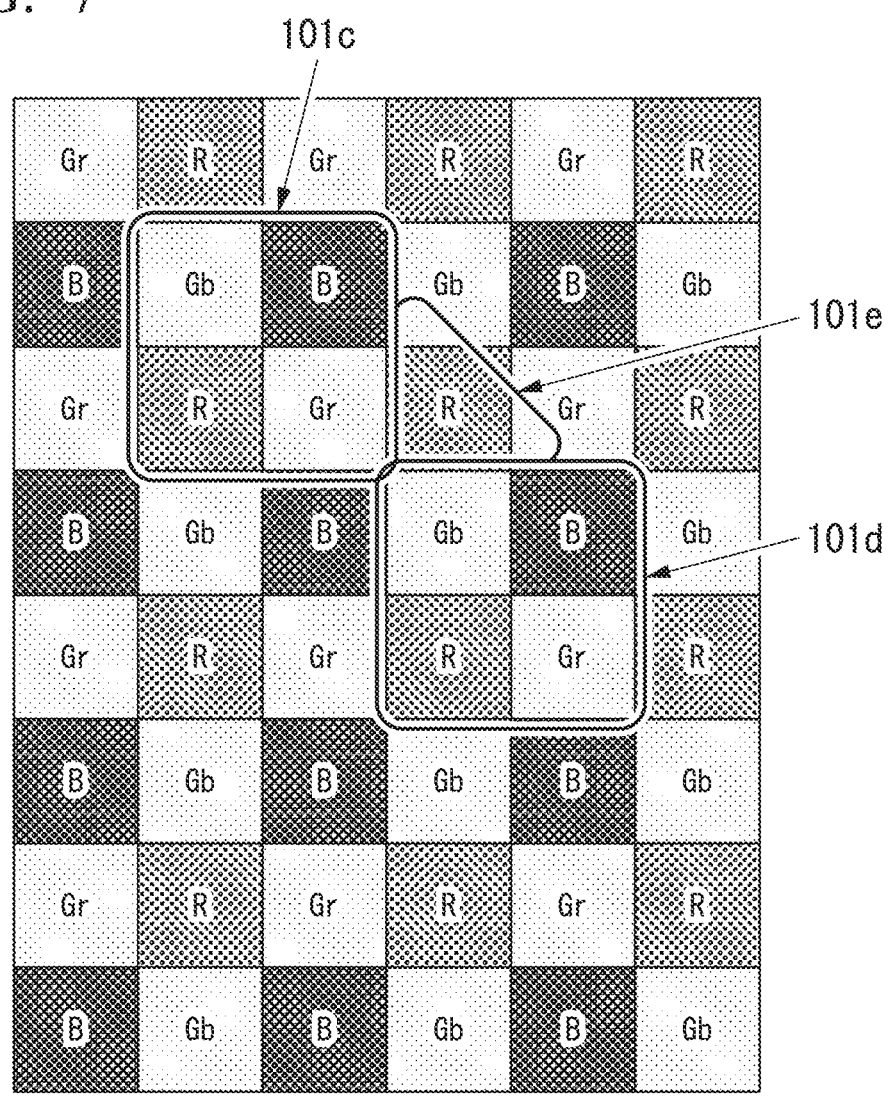
FIG. 7 is a diagram showing an example of a second combination method of pixel cells included in one pixel group in the solid-state imaging device according to the embodiment of the present invention.

Next, another combination of pixel cells 101 included in one pixel group in the solid-state imaging device 10 according to the embodiment will be described. FIG. 7 is a diagram showing an example of a second combination method of pixel cells 101 included in one pixel group in the solid-state imaging device 10 according to the embodiment of the present invention. FIG. 7 shows an example of a combination of pixel cells 101 within a pixel group when one pixel group is constituted of 8 pixel cells 101 when the solid-state imaging device 10 to which the color filter 1102 of the Bayer array is attached is viewed from the side on which light is incident. "Gr," "R," "Gb," and "B" shown in FIG. 7 are also similar to those of the first combination method shown in FIGS. 6A and 6B.

The second combination method is a combination method of designating a plurality of pixel cells 101 adjacent in the column direction and the row direction within the pixel array unit 100 as one pixel set, selecting a plurality of pixel sets in a checkered pattern in the arrangement of the pixel sets, and configuring the plurality of selected pixel sets as one pixel group. FIG. 7 shows a combination method when four pixel cells 101 adjacent in the column direction and the row direction in the pixel array unit 100 are designated as one pixel set and two pixel sets are configured as one pixel group. That is, FIG. 7 shows a combination method when eight pixel cells 101 are configured as one pixel group.

When the eight pixel cells 101 arranged in the pixel array unit 100 are configured as one pixel group in the second combination method, first, as shown in FIG. 7, the Gb pixel cell 101 of the second column-second row, the R pixel cell 101 of the second column-third row, the B pixel cell 101 of the second column-third row, and the Gr pixel cell 101 of the third column-third row are combined as one pixel set 101c. Further, as shown in FIG. 7, the Gb pixel cell 101 of the fourth column-fourth row, the R pixel cell 101 of the fourth column-fifth row, the B pixel cell 101 of the fifth column-fourth row, and the Gr pixel cell 101 of the fifth column-fifth row are combined as one pixel set 101d. Then, the pixel set 101c and the pixel set 101d are combined to configure one pixel group 101e. As described above, the combination of the pixel group 101e is a combination of pixel cells 101 configured to prevent pixel cells 101 of the same color adjacent in the column direction or the row direction from being included in the same pixel group 101e if the pixel cells 101 corresponding to the same wavelength band (color) are considered to be arranged on one surface.

For example, if the pixel cells 101 corresponding to the red wavelength band are considered to be arranged on one surface, the R pixel cell 101 of the second column-third row and the R pixel cell 101 of the fourth column-fifth row included in the pixel group 101e are not pixel cells 101 adjacent in the same column or row direction, but are pixel cells 101 arranged in an oblique direction. Likewise, if the pixel cells 101 corresponding to the blue wavelength band are considered to be arranged on one surface, the B pixel cell 101 of the third column-second row and the B pixel cell 101 of the fifth column-fourth row are also pixel cells 101 arranged in an oblique direction. Also, the Gb pixel cell 101 of the second column-second row and the Gb pixel cell 101 of the fourth column-fourth row in a case in which the pixel cells 101 corresponding to the green wavelength band of the blue row are considered to be arranged on one surface, or the Gr pixel cell 101 of the third column-third row and the Gr pixel cell 101 of the fifth column-fifth row in a case in which the pixel cells 101 corresponding to the green wavelength band of the red row are considered to be arranged on one surface are also pixel cells 101 arranged in an oblique direction.

Further, even when the pixel cells 101 corresponding to the green wavelength band are considered to be arranged on one surface, the Gb pixel cell 101 of the second column-second row, the Gr pixel cell 101 of the third column-third row, the Gb pixel cell 101 of the fourth column-fourth row, and the Gr pixel cell 101 of the fifth column-fifth row are pixel cells 101 arranged in an oblique direction.

Even when a connection failure occurs in the connection electrode unit 130 shared by the pixel group 101e and the pixel cells 101 included in the pixel group 101e become a defective pixels in the solid-state imaging device 10, it is possible to perform a process of generating (interpolating) a pixel signal of a pixel cell 101 included in the pixel group 101e on the basis of pixel signals of peripheral pixel cells 101 included in another pixel group as in the first combination method shown in FIGS. 6A and 6B through die combination in such a manner. A camera equipped with the solid-state imaging device 10 can generate an image without failing.

More specifically, for example, if the R pixel cell 101 of the fourth column-fifth row becomes a defective pixel, it is possible to generate (interpolate) a pixel signal of the R pixel cell 101 of the fourth column-fifth row on the basis of pixel signals of the R pixel cell 101 of the fourth column-third row, the R pixel cell 101 of the second column-fifth row, the R pixel cell 101 of the fourth column-seventh row, and the R pixel cell 101 of the sixth column-fifth row.

Here, in the conventional solid-state imaging device, for example, a case in winch eight pixel cells 101 including four pixel cells 101 in the second to fifth columns of the second row and four pixel cells 101 in the second to fifth columns of the third row shown in FIG. 7 are combined as one pixel group is considered. In this case, if a connection failure occurs in the connection electrode unit 130 shared by this pixel group in the conventional solid-state imaging device, pixel cells 101 of the same color of the same row included in this pixel group (for example, the R pixel cell 1101 of the second column and R pixel cell 101 of the fourth column in the third row) become defective pixels at the same time. Thus, in the conventional solid-state imaging device, it is impossible to generate (interpolate) pixel signals of the R pixel cells 101 adjacent in the same third row even in the image processing of the defective pixel correction, if the R pixel cell 101 of the second column and the R pixel cell 101 of the fourth column in the third row, i.e., pixel cells 101 corresponding to the red wavelength band, are considered to be arranged on one surface.

In this manner, in the solid-state imaging device 10, one pixel group is configured by pixel cells 101 included in a plurality of pixel sets obtained by selecting pixel sets each including a plurality of pixel cells 101 adjacent in the column direction and the row direction in a checkered pattern among a plurality of pixel cells 101 arranged within the pixel array unit 100 according to the second combination method. Thereby, in the solid-state imaging device 10, it is possible to easily generate (interpolate) a pixel signal of the pixel cell 101 serving as the defective pixel even when a connection failure occurs in the connection electrode unit 130 shared by any pixel group as in the first combination method. Thereby, a defect rate can also be reduced according to the second combination method in the solid-state imaging device 10 and the cost of the solid-state imaging-device 10 can be reduced.

Also, in the second combination method shown in FIG. 7, a case in which the pixel group 101e obtained by integrating the pixel set 101c and the pixel set 101d has been described. That is, in the second combination method shown in FIG. 7, a case in which one pixel group is configured by selecting pixel sets adjacent in an oblique direction has been described. However, in the solid-state imaging device 10, one pixel group may be configured by, for example, applying the concept of the first combination method to the second combination method and selecting pixel sets arranged at alternate positions (at the positions of skipping one pixel set) in the column direction or the row direction. Also, in the solid-state imaging device 10, one pixel group may be configured by, for example, applying the concepts of the first combination method and the second combination method and selecting four pixel sets including pixel sets arranged at alternate positions in the column direction or the row direction and pixel sets arranged at alternate positions in the oblique direction.

Also, if the solid-state imaging device 10 is a solid-state imaging device that forms a monochrome image, a plurality of pixel cells 101 included in each pixel set in the second combination method are pixel cells 101 arranged at alternate positions (at the positions of skipping one pixel cell) in the same column or row. That is, in the solid-state imaging device that forms a monochrome image, the plurality of pixel cells 101 included in the pixel set are pixel cells 101 arranged at alternate positions in each of the column direction, the row direction, and the oblique direction.

According to the embodiment, there is provided a solid-state imaging device (the solid-state imaging device 10) having a structure in which a pixel unit (the pixel array unit 100) having a plurality of pixel cells (the pixel cells 101) arranged in a two-dimensional matrix is separately formed on a plurality of semiconductor substrates and the plurality of semiconductor substrates are stacked, wherein each pixel cell 101 has a photoelectric conversion unit that converts an incident light beam into an electric signal and outputs the electric signal, the solid-state imaging device 10 including: a first semiconductor substrate (the first semiconductor substrate 11) in which a plurality of photoelectric conversion circuits (the photoelectric conversion circuits 1110), which are some circuit elements of the pixel cells 101 including the photoelectric conversion unit, are formed in a two-dimensional matrix; a second semiconductor substrate (the second semiconductor substrate 12) in which a plurality of memory circuits (the memory circuits 1210), which are some other circuit elements of the pixel cells 101, are formed in a two-dimensional matrix, wherein the some other circuit elements of the pixel cell 101 include memory units that correspond to the photoelectric conversion circuits, store electric signals output by the photoelectric conversion units, and output pixel signals according to the electric signals; and a connection electrode (the connection electrode unit 130) formed between the first semiconductor substrate 11 and the second semiconductor substrate 12 and electrically connected to a signal line of the photoelectric conversion circuits 1110 and a signal line of the memory circuits 1210, wherein the pixel cells 101 arranged in the pixel array unit 100 are divided into a plurality of pixel groups (the pixel group 101a, the pixel group 101b, the pixel group 101e, etc.) in which the pixel cells 101 are combined so that adjacent pixel cells 101 corresponding to the same wavelength band (pixel cells 101 of the same color) are not included if pixel cells 101 corresponding to light beams of the same wavelength band (color) are considered to be arranged on one surface, wherein the same connection electrode unit 130 is shared between the photoelectric conversion circuits 1110 (the photoelectric conversion circuits 1111 to 1114 and the like) and between the memory circuits 1210 (the memory circuits 1211 to 1214 and the like) of the pixel cells 101 included in the same pixel group, and wherein signal lines of the photoelectric conversion circuits 1110 and signal lines of the memory circuits 1210 of the pixel cells 101 included in different pixel groups are connected by different connection electrode units 130.

Also, according to the embodiment, in the solid-state imaging device 10, the pixel array unit 100 has a plurality of pixel cells 101 arranged to correspond to wavelength bands (colors) of a light beam separated into at least wavelength bands of three-types (colors), each of the pixel groups is configured so that a plurality of pixel sets (the pixel set 101c, the pixel set 101d, etc.) are combined, each pixel set serving as a set of the pixel cells 101 corresponding to at least wavelength bands of two types (colors) within the plurality of pixel cells 101, and pixel cells 101 corresponding to the same wavelength band (color) included in different pixel sets (the pixel set 101c or the pixel set 101d) combined in the same pixel group (the pixel group 101e) are not arranged at adjacent positions if the pixel cells 101 corresponding to the same wavelength band (color) are considered to be arranged on one surface.

Also, according to the embodiment, in the solid-state imaging device 10, the pixel array unit 100 includes the pixel cell 101 (the R pixel cell 101 ) corresponding to a red (R) wavelength band (color), the pixel cell 101 (the Gr pixel cell 101 and the Gb pixel cell 101) corresponding to a green (Gr and Gb) wavelength band (color), and the pixel cell 101 (the B pixel cell 101) corresponding to a blue (B) wavelength band (color) arrayed in a Bayer array, each of the pixel groups (for example, the pixel group 101e) is configured so that a plurality of pixel sets (the pixel set 101c, the pixel set 101d, etc.) are combined, each pixel set serving as a set of at least pixel cells 101 of two types among the R pixel cell 101 corresponding to the red (R) wavelength band (color), the Gr pixel cell 101 or Gb pixel cell 101 corresponding to the green (Gr or Gb) wavelength band (color), and the B pixel cell 101 corresponding to the blue (B) wavelength band (color), and pixel cells 101 corresponding to the same wavelength band (color) included in different pixel sets (the pixel set 101c or the pixel set 101d) combined in the same pixel group (the pixel group 101e) are not arranged at adjacent positions if the pixel cells 101 corresponding to the same wavelength band (color) are considered to be arranged on one surface.

Also, according to the embodiment, in the solid-state imaging device 10, the pixel array unit 100 includes a plurality of pixel cells 101 arranged to correspond to a wavelength band (color) of all visible light, and each of the pixel groups is configured so that a plurality of pixel cells 101 that are not arranged at adjacent positions are combined within the plurality of pixel cells 101.

Also, according to the embodiment, in the solid-state imaging device 10, the pixel group is configured so that a plurality of pixel sets arranged in a checkered shape in an arrangement of the pixel sets within the pixel unit are combined.

Also, according to the embodiment, in the solid-state imaging device 10, the pixel group is configured so that a plurality of pixel sets arranged at alternate positions in a direction in which the pixel cells included in the pixel set are arranged in an arrangement of the pixel sets within the pixel unit are combined.

Also, according to the embodiment, in the solid-state imaging device 10, the pixel group (for example, the pixel group 101e) is configured so that a plurality of pixel sets (the pixel sets 101c or the pixel sets 101d) arranged in a checkered shape in an arrangement of the pixel sets within the pixel array unit 100 are combined.

Also, according to the embodiment, in the solid-state imaging device 10, the pixel group (for example, the pixel group 101a or the pixel group 101b) is configured so that a plurality of pixel sets arranged at alternate positions in a direction in which the pixel cells 101 included in the pixel sets are arranged in an arrangement of the pixel sets within the pixel array unit 100 are combined.

Also, according to the embodiment, in the solid-state imaging device 10, the pixel group is configured so that a plurality of pixel cells 101 arranged in a checkered shape in an arrangement of the pixel cells 101 within the pixel array unit 100 are combined.

Also, according to the embodiment, in the solid-state imaging device 10, the pixel group is configured so that a plurality of pixel cells 101 arranged at alternate positions in a predetermined direction in an arrangement of the pixel cells 101 within the pixel array unit 100 are combined.

Also, according to the embodiment, the solid-state imaging device 10 is configured so that, if a connection failure of the connection electrode unit 130 in any pixel group (the pixel group 101a, the pixel group 101b, the pixel group 101e, or the like) has occurred, the solid-state imaging device 10 interpolates the pixel signal output by each pixel cell 101 included in the pixel group using pixel signals output by pixel cells 101 which are included in another pixel group connected by a connection electrode unit 130 different from the connection electrode unit 130 in which a connection failure has occurred and which correspond to the same wavelength band (color) arranged at an adjacent position when pixel cells 101 corresponding to the same wavelength band (color) are considered to be arranged on one surface.

As described above, according to the embodiment of the present invention, when pixel cells corresponding to the same wavelength band (color) are considered to be arranged on one surface in a solid-state imaging device configured by stacking a plurality of semiconductor substrates, pixel cells included in each pixel group are combined so that adjacent pixel cells, i.e., consecutive pixel cells of the same color, are not included in the same pixel group. In the embodiment of the present invention, when pixel cells included in the pixel group are separately formed for the first semiconductor substrate and the second semiconductor substrate, the pixel cells included in the pixel group share the same connection electrode unit. Thereby, according to the embodiment of the present invention, it is possible to reduce the number of connection electrode units which electrically connect the component of the pixel cell formed on the first semiconductor substrate and the component of the same pixel cell formed on the second semiconductor substrate. Thereby according to the embodiment of the present invention, it is possible to reduce the probability of a connection failure in the connection electrode unit in the solid-state imaging device.

Moreover, in the embodiment of the present invention, as described above, each pixel group does not include consecutive pixel cells of the same color. Thus, according to the embodiment of the present invention, even when a connection failure occurs in the connection electrode unit shared by any pixel group and pixel cells included in the pixel group become defective pixels, it is possible to easily generate (interpolate) a pixel signal of the defective pixel on the basis of pixel signals of pixel cells included in a pixel group sharing a different connection electrode unit in image processing for defective pixel correction to be executed later. Thereby, in the imaging apparatus equipped with the solid-state imaging device of the present invention, it is possible to limit the degradation in image quality doe to a defective pixel of a generated image without causing a process of generating an image to fail due to defective pixels. Thereby, the probability of the solid-state imaging device of the present invention being treated as a defective product (a defect rate) can be reduced.

Thereby, according to the embodiment of the present invention, it is possible to reduce the cost of the solid-state imaging device. In the embodiment of the present invention, it is also possible to improve the reliability of the solid-state imaging device with high performance, high functionality, and size reduction.

Also, a configuration in which a camera (an imaging apparatus) equipped with the solid-state imaging device 10 generates (interpolates) a pixel signal of the defective pixel by image processing for defective pixel correction to be executed later if a connection failure occurs in the connection electrode unit 130 shared by any pixel group in the solid-state imaging device 10 and a pixel cell 101 included in the pixel group becomes a defective pixel has been described. However, the present invention is not limited to a configuration in which the process of correcting defective pixels is performed by the camera equipped with the solid-state imaging device 10. For example, a processing unit that performs a process of defective pixel correction may be provided within the solid-state imaging device 10, and the solid-state imaging device 10 that externally outputs a pixel signal on which the defective pixel correction process has been performed by the processing unit, i.e., an interpolated pixel signal, may be configured. Also, the defective pixel correction process may be performed by the column processing circuit 300 or the horizontal drive circuit 400 provided in the solid-state imaging device 10.

Also, the configuration of the solid-state imaging device in which the two semiconductor substrates of the first semiconductor substrate 11 and the second semiconductor substrate 12 are stacked has been described in the embodiment. However, the number of substrates stacked in the solid-state imaging device as described above is not limited to two, and more substrates may be configured to be stacked.

Further, in the embodiment, the case in which the Bayer array color filter is attached to the solid-state imaging device has been described as an example. That is, in the embodiment, the combination of the pixel cells included in the pixel group has been described in the Bayer array solid-state imaging device. However, the color arrangement and the arrangement of the pixel cells in the color filter attached to the solid-state imaging device are not limited to the above-described Bayer array and the concept of the present invention can be similarly applied to a solid-state imaging device of another array (for example, a so-called honeycomb array in which pixel cells are arranged in a honeycomb shape).

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device having a structure in which a pixel unit having a plurality of pixel cells arranged in a two-dimensional matrix is separately formed on a plurality of semiconductor substrates and the plurality of semiconductor substrates are stacked, wherein each pixel cell has a photoelectric conversion unit that converts an incident light beam into an electric signal and outputs the electric signal, the solid-state imaging device comprising:
a first semiconductor substrate in which a plurality of photoelectric conversion circuits, which are some circuit elements of the pixel cells including the photoelectric conversion unit, are formed in a two-dimensional matrix;
a second semiconductor substrate in which a plurality of memory circuits, which are some other circuit elements of the pixel cells, are formed in a two-dimensional matrix, wherein the some other circuit elements of the pixel cells include memory units that correspond to the photoelectric conversion circuits, store electric signals output by the photoelectric conversion units, and output pixel signals according to the electric signals; and
a connection electrode formed between the first semiconductor substrate and the second semiconductor substrate and electrically connected to a signal line of the photoelectric conversion circuits and a signal line of the memory circuits,
wherein the pixel cells arranged in the pixel unit are divided into a plurality of pixel groups in which the pixel cells are combined so that adjacent pixel cells corresponding to the same wavelength baud are not included if pixel cells corresponding to light beams of the same wavelength band are considered to be arranged on one surface,
wherein die same connection electrode is shared between the photoelectric conversion circuits and between the memory circuits of the pixel cells included In the same pixel group, and
wherein signal lines of the photoelectric conversion circuits and signal lines of the memory circuits of the pixel cells included in different pixel groups are connected by different connection electrodes.

2. The solid-suite imaging device according to claim 1,
wherein the pixel unit has a plurality of pixel cells arranged to correspond to wavelength bands of a light beam separated into at least wavelength bands of three types,
wherein each of the pixel groups is configured so that a plurality of pixel sets are combined, each pixel set serving as a set of the pixel cells corresponding to at least wavelength bands of two types within the plurality of pixel cells, and
wherein pixel cells corresponding to the same wavelength band included in different pixel sets combined in the same pixel group are not arranged at adjacent positions if the pixel cells corresponding to the same wavelength band are considered to be arranged on one surface.

3. The solid-state imaging device according to claim 1,
wherein the pixel unit includes the pixel cell corresponding to a red wavelength bands the pixel cell corresponding to a green-wavelength band, and the pixel cell corresponding to a blue wavelength band arrayed in a Bayer array,
wherein each of the pixel groups is configured so that a plurality of pixel sets are combined, each pixel set serving as a set of at least pixel cells of two types among the pixel cell corresponding to the red wavelength band, the pixel cell corresponding to the green wavelength band, and the pixel cell corresponding to the blue wavelength band, and
wherein pixel cells corresponding to the same wavelength band included in different pixel sets combined in the same pixel group are not arranged at adjacent positions if the pixel cells corresponding to the same wavelength band are considered to be arranged on one surface.

4. The solid-state imaging device according to claim 1,
wherein the pixel unit includes a plurality of pixel cells arranged to correspond to a wavelength band of all visible light, and
wherein each of the pixel groups is configured so that a plurality of pixel cells that are not arranged at adjacent positions are combined within the plurality of pixel cells.

5. The solid-state imaging device according to claim 2,
wherein the pixel group is configured so that a plurality of pixel sets arranged in a checkered shape in an arrangement of the pixel sets within the pixel unit are combined.

6. The solid-state imaging device according to claim 2,
wherein the pixel group is configured so that a plurality of pixel sets arranged at alternate positions in a direction in which the pixel cells included in the pixel set are arranged in an arrangement of the pixel sets within the pixel unit are combined.

7. The solid-state imaging device according to claim 3,
wherein the pixel group is configured so that a plurality of pixel sets arranged in a checkered shape in an arrangement of the pixel sets within the pixel unit are combined.

8. The solid-state imaging device according to claim 3,
wherein the pixel group is configured so that a plurality of pixel sets arranged at alternate positions in a direction in which the pixel cells included in the pixel set are arranged in an arrangement of the pixel sets within tire pixel unit are combined.

9. The solid-state imaging device according to claim 4, wherein the pixel group is configured so that a plurality of pixel cells arranged in a checkered shape in an arrangement of the pixel cells within the pixel unit are combined.

10. The solid-state imaging device according to claim 4, wherein the pixel group is configured so that a plurality of pixel cells arranged at alternate positions in a predetermined direction in an arrangement of the pixel cells within the pixel unit are combined.

11. The solid-state imaging device according to claim 1, wherein, if a connection failure of the connection electrode in any pixel group has occurred, the solid-state imaging device interpolates the pixel signal output by each pixel cell included in the pixel group using pixel signals output by pixel cells which are included in another pixel group connected by a connection electrode different from the connection electrode in which a connection failure has occurred and which correspond to the same wavelength band arranged at an adjacent position when the pixel cells corresponding to the same wavelength band are considered to be arranged on one surface.

* * * * *